(12) United States Patent
Suzuki et al.

(10) Patent No.: US 8,672,718 B2
(45) Date of Patent: Mar. 18, 2014

(54) BOARD CONNECTING TERMINAL AND HOLDING STRUCTURE OF CIRCUIT BOARD

(71) Applicant: Yazaki Corporation, Tokyo (JP)

(72) Inventors: Yasuo Suzuki, Shizuoka (JP); Shinji Yamada, Kanagawa (JP); Hirohito Toriyama, Kanagawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/913,205

(22) Filed: Jun. 7, 2013

(65) Prior Publication Data

US 2013/0273753 A1      Oct. 17, 2013

Related U.S. Application Data

(63) Continuation of application No. PCT/JP2012/051135, filed on Jan. 13, 2012.

(30) Foreign Application Priority Data

Jan. 13, 2011   (JP) .................................. 2011-005050

(51) Int. Cl.
*H01R 4/02*   (2006.01)

(52) U.S. Cl.
USPC ......................................................... 439/876

(58) Field of Classification Search
USPC ...................................... 439/875, 853, 83, 79
See application file for complete search history.

(56) References Cited

U.S. PATENT DOCUMENTS

| 2,503,559 | A | * | 4/1950 | Miloche ......................... 439/858 |
| 3,140,907 | A | * | 7/1964 | Davies ............................ 439/59 |
| 3,864,007 | A | * | 2/1975 | Plyler et al. ................... 439/76.1 |
| 4,401,356 | A | * | 8/1983 | Bare .............................. 439/329 |

FOREIGN PATENT DOCUMENTS

| JP | 1-170961 U | 12/1989 |
| JP | 7-201384 A | 8/1995 |
| JP | 2006-260842 A | 9/2006 |

OTHER PUBLICATIONS

International Search Report and Written Opinion of the International Search Report for PCT/JP2012/051135 dated Mar. 22, 2012.

* cited by examiner

*Primary Examiner* — Phuong Dinh
(74) *Attorney, Agent, or Firm* — Kenealy Vaidya LLP

(57) ABSTRACT

A board connecting terminal includes a contact that comes into contact with a mate side terminal, an indent that comes into contact with a pad formed on a circuit board, a terminal attaching part connected to the indent to attach the board connecting terminal to the circuit board, and an engaging piece connected to the contact and having a part held by a holder on which the circuit board is mounted. In the terminal attaching part, when the board connecting terminal is attached to the circuit board, a part of the terminal attaching part enters a through hole passing through the circuit board in a thickness direction thereof to restrain the indent from moving in a planar direction of the circuit board.

4 Claims, 9 Drawing Sheets

BOARD CONNECTING TERMINAL AND HOLDING STRUCTURE OF CIRCUIT BOARD

CROSS REFERENCE TO RELATED APPLICATION

This application is a continuation of PCT application No. PCT/JP2012/051135, which was filed on Jan. 13, 2012 based on Japanese Patent Applications No. 2011-005050 filed on Jan. 13, 2011, the contents of which are incorporated herein by reference.

BACKGROUND OF THE INVENTION

1. Technical Field

The present invention relates to a board connecting terminal which is attached together with a circuit board and a holding structure of a circuit board.

2. Background Art

Usually, a structure is proposed that uses a spring structure in an end part of a connector pin and holds a pad on a circuit board by the spring structure to connect a connector terminal to a circuit on the circuit board (for instance, see JP-A-7-201384). In a connecting structure of the connector pin and the circuit board, as shown in FIG. 9 and FIG. 10, the connector pin 1 including a clip main body 5 having a pair of clip parts 3 and 4 which form a holding clearance between them and a lead part 6 extended to a rear surface side of the clip main body 5 is pressed-in to an edge part of the circuit board 9 to connect at least one clip part 3 to a connecting terminal 10 of the circuit board 9.

In the connecting structure of the connector pin and the circuit board, in the clip part 3 connected to the connecting terminal 10, an engaging protruding part 7 is formed which protrudes toward an inner part of the holding clearance. Further, on the surface of the connecting terminal 10 of the circuit board 9, an insulating layer 2 is formed so that parts corresponding to the forms of the engaging protruding parts 7 in which the insulating layer 2 is not formed are partly located and the parts in which the insulating layer 2 is not formed are set as engaging recessed parts 50. Then, the engaging protruding parts 7 are engaged with the engaging recessed parts 50 so that their ends are connected to the surfaces of the connecting terminals 10.

Therefore, according to the above-described connecting structure of the connector pin and the circuit board, if the clip main body 5 of the connector pin 1 is pressed-in to the circuit board 9, when the engaging protruding part 7 is engaged with the engaging recessed part 50, the connector pin 1 is precisely positioned to the circuit board 9 and the connector pin 1 is electrically conducted to the connecting terminal 10 through the engaging protruding part 7. After that, the above-described engaged state is maintained by a resiliency originally provided in the clip parts 3 and 4. Accordingly, arrangement pitches of the connector pins 1 respectively pressed-in to the plurality of connecting terminals 10 on the circuit board 9 are not disordered after the connector pins are pressed-in thereto. Thus, as long as the above-described engaged state is maintained by the resiliency, the connector pin has an extremely high strength to a force in a slipping-off direction exerted on the connector pin 1.

As compared therewith, when a transverse force is applied to the connector pin 1, especially when the transverse force is applied to the lead part 6 so that a large moment for inclining the clip main body 5 operates, if the engaging recessed part 50 and the engaging protruding part 7 have forms whose cross-sectional forms are rectangular forms or elliptical forms so as not to generate a relative rotation between both the parts, the connector pin 1 is not inclined and is maintained in a normal position. Further, even if the cross-sectional forms of the engaging protruding part 7 and the engaging recessed part 50 are circular, an inclination of the connector pin 1 is suitably prevented by a frictional force generated between both the parts.

As a result, in the connecting structure of the connector pin and the circuit board, the connector pin 1 is precisely positioned to the connecting terminal 10 of the circuit board 9, the arrangement pitches of the connector pins 1 are maintained in a uniform state even by the use for a long time after the press-in thereof and the positions of the connector pins 1 are not respectively disordered. Thus, an imperfect short-circuit is prevented between the adjacent connector pins and a reinforcement by a resin may not need to be carried out. Consequently, the number of work processes can be reduced. Further, a reliability of a connected state of the circuit board 9 and the connector pin 1 is improved, so that the lead part 6 of the connector pin 1 is effectively connected to other circuit board and a productive efficiency is improved.

SUMMARY OF THE INVENTION

The above-described usual connecting structure of the connector pin and the circuit board has below-described problems to be solved.

Namely, the engaging protruding part 7 provided in the resilient clip 3 is engaged with the engaging recessed part 50 formed in the insulating layer 2 on the circuit board 9 so that the connector pin 1 may meet an external force in the slipping off direction or the transverse direction exerted on the connector pin 1. However, the direction or the level of the external force is different depending on uses. Especially, in the connecting structure mounted on a vehicle, since the external force or a vibration continues for a long time, the resiliency of the clip parts 3 and 4 that produce a holding force is progressively deteriorated. Accordingly, an engaging force of the engaging protruding part 7 relative to the engaging recessed part 50 is loosened so that the adjacent connector pins 1 come into contact mutually (short-circuited). Thus, the reliability of the connected state of the connector pin 1 and the connecting terminal 10 on the circuit board 9 is inconveniently lowered.

Further, in the connector pin 1, the lead part 6 is occasionally soldered to a pad of other circuit board. If the connector pin 1 is used for connecting a mate side connector, when the connector pin receives a connector operating force (an operating force for attachment and detachment such as a pushing-in force or a tensile force) of the mate side connector, an engagement of the engaging protruding part 7 and the engaging recessed part 50 is simply disengaged. Thus, a reliability of a connecting performance of the connector pin 1 and the connecting terminal 10 on the circuit board 9 is inconveniently lowered.

The present invention is devised by considering the above-described circumstance, and it is an object of the present invention to provide a board connecting terminal and a holding structure of a circuit board that can stably hold an aligned state of a terminal main body to a circuit board, stably hold a holder or the circuit board installed in the holder even when an external force received by an attaching and detaching operation of a mate side connector to a contact or a continuous external vibration is applied and can prevent a deformation of the terminal main body including the contact.

In order to achieve the above-described object, a board connecting terminal according to the present invention is characterized by below-described (1) to (3).

(1) A board connecting terminal including:
a contact that comes into contact with a mate side terminal;
an indent that comes into contact with a pad formed on a circuit board;
a terminal attaching part connected to the indent to attach the board connecting terminal to the circuit board; and
an engaging piece connected to the contact and having a part held by a holder on which the circuit board is mounted, wherein in the terminal attaching part, when the board connecting terminal is attached to the circuit board, a part of the terminal attaching part enters a through hole passing through the circuit board in the thickness direction thereof to restrain the indent from moving in a planar direction of the circuit board, when the circuit board is mounted on the holder, a part of the engaging piece is accommodated in an engaging piece accommodating groove formed in the holder to restrain the contact from moving in the longitudinal direction and in the transverse direction of the contact and when the circuit board is mounted on the holder, a part of the contact abuts on an upper surface of the holder and a part of the terminal attaching part abuts on a lower surface of the circuit board to restrain the contact and the terminal attaching part from moving in the thickness direction of the circuit board.
(2) In a board connecting terminal having the structure of the above-described (1), in the terminal attaching part, when the board connecting terminal is attached to the circuit board, a part of the terminal attaching part enters the through hole of a front surface side of the circuit board and another part of the terminal attaching part enters the though hole of a back surface side of the circuit board.
(3) In a board connecting terminal having the structure of the above-described (1) or (2) which further includes a metal piece connected to the terminal attaching part and the engaging piece, wherein the indent comes into contact with the pad formed on the surface of the circuit board and when the circuit board is mounted on the holder, a part of the metal piece abuts on a lower surface of the circuit board.

According to the board connecting terminal having the structure of the above-described (1), since a part of the terminal attaching part having a resiliency is engaged with the through hole of the circuit board to prevent a planar movement of the circuit board, the engaging pieces are accommodated in the engaging piece accommodating grooves of the holder, further, the contact is allowed to abut on the upper surface of the holder and another part of the terminal attaching part is allowed to abut on the lower surface of the circuit board, the planar movement of the indent on the pad, the movement of the contact in the longitudinal direction and in the transverse direction and the movement or dislocation of the contact and the terminal attaching part in the thickness direction of the circuit board can be respectively regulated at the same time. Accordingly, can be avoided the deformation or distortion of the contact itself and the board connecting terminal including the terminal attaching part by an external force in a pulling direction or a pushing in direction (a compressing direction) which the contact receives during an attachment and detachment of a mate side connector and an imperfect connection of the mate side connector to the contact due to the deformation or the distortion. As a result, the external force is properly applied to the contact during a connection of the mate side connector to obtain a suitable electrical and mechanical connection to the mate side connector under a state that an aligned state of the board connecting terminals is maintained. Further, even when a continuous external vibration is applied to the board connecting terminal, a resilient contact of the indent and the pad and a prescribed aligned state can be stably maintained by a high holding force of the holder itself of the board connecting terminal.

According to the board connecting terminal having the structure of the above-described (2), the terminal attaching part is held in a prescribed position of the circuit board sandwiched thereby and the indent can be more assuredly and stably held at a prescribed position on the pad without moving in the planar direction of the circuit board.

According to the board connecting terminal having the structure of the above-described (3), the metal piece supports the lower surface of the board, so that the indent can be more assuredly and stably connected to the pad on the circuit board by receiving a resilient operation of the terminal attaching part.

In order to achieve the above-described object, a holding structure of a circuit board according to the present invention is characterized by a below-described (4).

(4) A holding structure of a circuit board that mounts on a holder the circuit board to which a board connecting terminal including a contact which comes into contact with a mate side terminal and an indent which comes into contact with a pad formed on the circuit board is attached, the board connecting terminal further including:
a terminal attaching part connected to the indent to attach the board connecting terminal to the circuit board; and
an engaging piece connected to the contact and having a part held by the holder on which the circuit board is mounted, an engaging piece accommodating groove being formed in the holder which accommodates a part of the engaging piece, wherein in the terminal attaching part, when the board connecting terminal is attached to the circuit board, a part of the terminal attaching part enters a through hole passing through the circuit board in the thickness direction thereof to restrain the indent from moving in a planar direction of the circuit board, when the circuit board is mounted on the holder, the engaging piece is accommodated in the engaging piece accommodating groove to restrain the contact from moving in the longitudinal direction and in the transverse direction of the contact and when the circuit board is mounted on the holder, a part of the contact abuts on an upper surface of the holder and a part of the terminal attaching part abuts on a lower surface of the circuit board to restrain the contact and the terminal attaching part from moving in the thickness direction of the circuit board.

According to the holding structure of the circuit board having the structure of the above-described (4), when the circuit board is mounted on the holder, the movement or dislocation of the board connecting terminal substantially in all directions can be regulated and an assembled body of the board connecting terminal and the circuit board can be stably held in the holder by an engagement of the engaging pieces with the engaging piece accommodating grooves of the holder side, an abutment of the contact on the upper surface of the holder and an abutment of the terminal attaching part on the lower surface of the circuit board.

Further, in order to achieve the above-described object, a board connecting terminal according to the present invention is characterized by below-described (5) and (6).

(5) A board connecting terminal having any one of the structures of the above-described (1) to (3), wherein the terminal attaching part has a contact surface abutting on an end face of the circuit board when the board connecting terminal is attached to the circuit board.

(6) A board connecting terminal having the structure of the above-described (3), wherein the engaging piece has a form of a plate, the metal piece is connected to one end of the engaging piece so that the metal piece is vertical to the engaging piece, the contact is connected to the other end of the engaging piece so that the contact is vertical to the engaging piece and the metal piece and the contact are located at positions opposed to each other.

According to the board connecting terminal having the structure of the above-described (5), the terminal attaching part can be prevented from rotating on the through hole of the circuit board as a center, a pushing in force (a compressing force) of the terminal attaching part to a surface of the circuit board can be supported (regulated) and the deformation of the engaging piece or the terminal attaching part by the pushing in force can be assuredly prevented.

According to the board connecting terminal having the structure of the above-described (6), the metal piece connected to the one end of the engaging piece and the contact connected to the other end of the engaging piece form substantially a shape of U together with the engaging piece. Thus, the board connecting terminal having the above-described structure can be mounted in the holder at a time and a connecting (an attaching) stroke of the mate side connector to the contact can be sufficiently ensured and a connected state thereof can be stabilized.

Further, in order to achieve the above-described object, a holding structure of a circuit board according to the present invention is characterized by below-described (7) and (8).

(7) A holding structure of a circuit board having the structure of the above-described (4), wherein the engaging piece accommodating groove is formed along a direction in which the board is moved relative to the holder when the board is mounted on the holder and a part of the engaging piece enters the engaging piece accommodating groove when the board is mounted on the holder.

(8) A holding structure of a circuit board having the structure of the above-described (7), wherein on an upper surface of the holder, a contact accommodating groove is formed that accommodates at least a part of the contact when the circuit board is mounted on the holder.

According to the holding structure of the circuit board having the structure of the above-described (7), the engaging piece smoothly enters the engaging piece accommodating groove, and the circuit board is automatically attached to the holder, so that an attaching operation can be efficiently carried out.

According to the holding structure of the circuit board having the structure of the above-described (8), the contact is restrained form moving in a transverse direction in the contact accommodating groove and the mate side connector can be smoothly connected without causing a deformation of the contact.

According to the present invention, an aligned state of a terminal main body to the circuit board can be stably held, the holder or the circuit board installed in the holder can be stably held even when an external force received by an attaching and detaching operation of the mate side connector to the contact or a continuous external vibration is applied, and further, a deformation of the terminal main body including the contact can be prevented.

The present invention is briefly described above. Further, when the description of embodiments that will be described below is read by referring to the attached drawings, a detail of the present invention will be more apparent.

BRIEF DESCRIPTION OF THE DRAWINGS

FIG. 3A and FIG. 3B are perspective views respectively showing occasions of the procedure.

DETAILED DESCRIPTION OF THE EXEMPLARY EMBODIMENTS

Now, a board connecting terminal and a circuit board holder according to an exemplary embodiment of the present invention will be described below by referring to FIG. 1 to FIG. 8.

Figure 1:
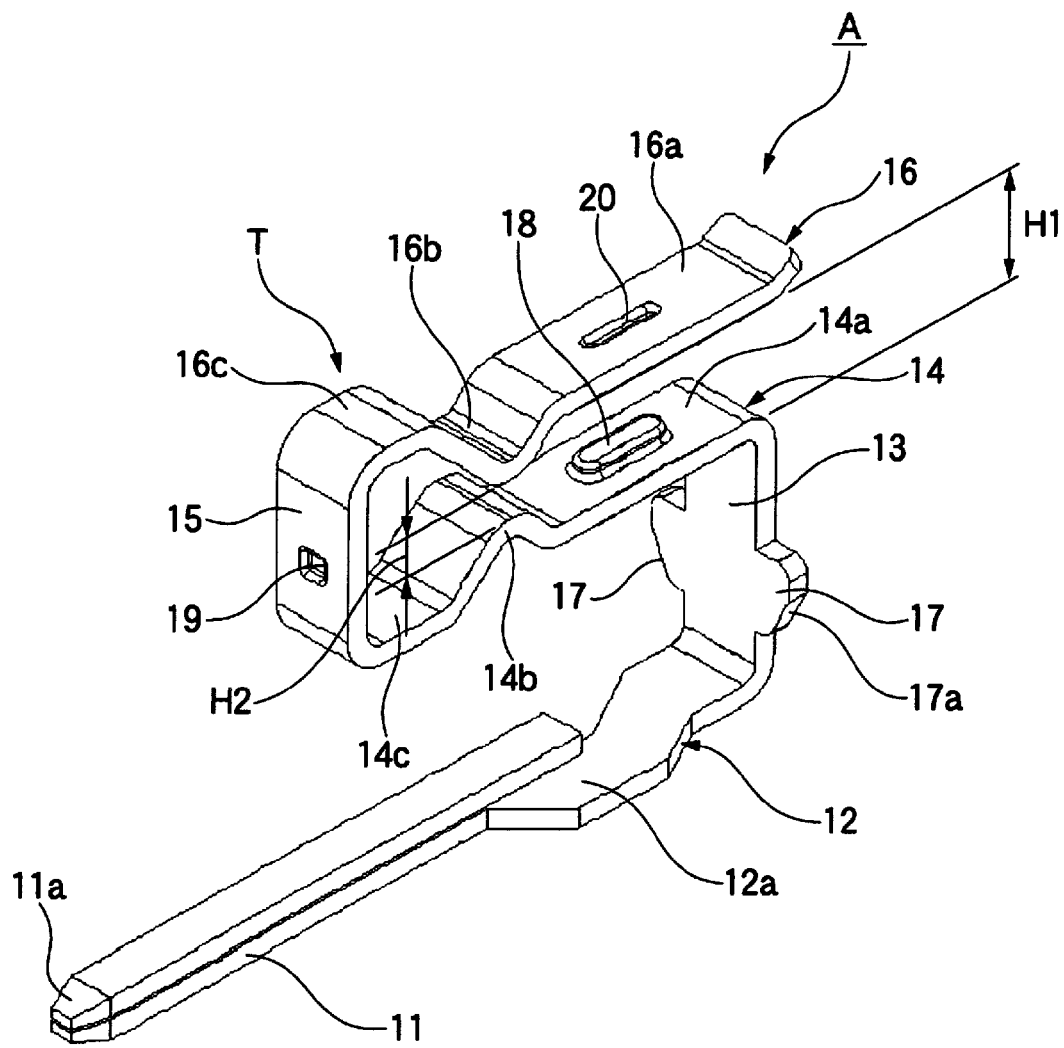
FIG. 1 is a perspective view showing a board connecting terminal according to an exemplary embodiment of the present invention.

A board connecting terminal A of the present exemplary embodiment shown in FIG. 1 is formed with an electrically conductive metal plate cut to the shape of a belt. After the belt shaped metal plate is stamped, bent and embossed by a press machine, the worked meal plate is attached to a below-described circuit board. Further, an assembled body of the board connecting terminal A and the circuit board is set in a below-described holder, and then, the assembled body is attached to a ceiling of a vehicle as a vehicle room lighting device.

The board connecting terminal A is bent substantially in the shape of S seen from a side part and includes a contact 11, a contact support piece 12, a vertical support piece 13, a lower metal piece 14, a vertical metal piece 15 and an upper metal piece 16. The contact 11 of these members is formed by bending one end part of the metal plate over a prescribed length to overlap the metal plate double. An end part of the overlapped metal plate is formed as a cut surface 11a which is cut to a tapered shape. The cut surface 11a is provided to smoothly connect a mate side connector to the contact 11.

The contact support piece 12 is connected to a rear end part (an end part in an opposite direction to the direction of the cut surface 11a) of the contact 11 so as to be extended to a rear part of the contact 11. The contact support piece 12 is horizontally formed together with the contact 1, however, has a form deviating in a horizontal direction, that is, an offset form which is deformed with its position deviating slightly from an axial direction of the contact 11. This offset part 12a has a form following a guide groove on a below-described holder.

The above-described vertical support piece 13 is formed to stand upright substantially in a vertical direction so as to be connected to a rear end of the contact support piece 12. Engaging pieces 17 protrude respectively at positions of side edges of the vertical support piece 13 opposed to each other in a direction of width. These engaging pieces 17 have end edges in the direction of width cut off obliquely downward over lower half parts to have inclined edges 17a. These inclined edges 17a make it possible to smoothly insert the engaging pieces into engaging piece accommodating grooves formed in the below-described holder.

The above-described lower metal piece 14 is connected to an upper end part of the vertical support piece 13 in the horizontal direction so as to face an upper part of the contact 11 (an upper part in a vertical surface) with a prescribed space provided. The lower metal piece 14 includes a first horizontal part 14a, a first bent part 14b continuous to the first horizontal part 14a and bent in the shape of inverted V and a second horizontal part 14c continuous to the first bent part 14b and extending in the horizontal direction with a height a little lower than the first horizontal part 14a. Substantially in the vicinity of a center of the first horizontal part 14a, an elliptical indent 18 is formed which protrudes on an upper surface.

The vertical metal piece 15 is connected to an end of the second horizontal part 14c so as to stand upright in the vertical direction. In a central part of the vertical metal piece 15, a substantially rectangular indent 19 is formed which protrudes to an inner part thereof (in the direction where the first bent part 14b is provided). Further, the above-described upper metal piece 16 is connected to an upper end part of the vertical metal piece 15 in the horizontal direction so as to face an upper part of the lower metal piece 14 with a prescribed space provided.

The upper metal piece 16 includes a fourth horizontal part 16c, a second bent part 16b continuous to the fourth horizontal part 16c and bent in the shape of V and a third horizontal part 16a continuous to the second bent part 16b and extending in the horizontal direction with a height a little lower than the fourth horizontal part 16c. Substantially in the vicinity of a center of the third horizontal part 16a, an indent 20 is formed which protrudes on a lower surface of the upper metal piece 16. Further, the second bent part 16b, the fourth horizontal part 16c, the vertical metal piece 15, the second horizontal part 14c and the first bent part 14b form a terminal attaching part T that resiliently hold upper and lower surfaces of the circuit board B. Here, a vertical space H1 between the lower metal piece 14 and the upper metal piece 16 has a dimension near to the thickness of the below-described circuit board B. A vertical space H2 between the top parts of the first bent part 14b and the second bent part 16b opposed to each other is smaller than the thickness of the circuit board B.

Figure 2:
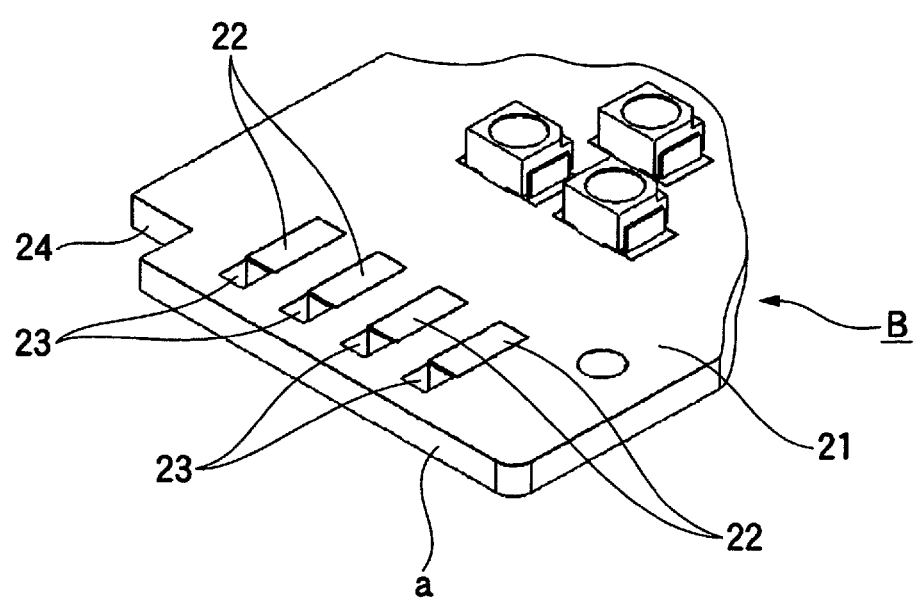
FIG. 2 is a perspective view showing main parts of a circuit board in the present invention.

FIG. 2 shows the circuit board B as an object to which the board connecting terminal A is attached. The circuit board B forms a functional part of the lighting device together with the holder (a case) of the vehicle room lighting device as described below. On an upper surface of the circuit board B, a plurality of pads 22 having the same size are aligned and arranged at a position near one side edge of an insulating board 21. The pads 22 are provided at positions to which the indents 20 can be assuredly connected (connected under pressure) when the board connecting terminal A is attached to the circuit board B. In this case, the indent 18 not only simply supports a lower surface of the circuit board B, but also may abut on a pad (not shown in the drawing) provided in a lower surface of the circuit board B as required.

Further, electronic parts or wiring patterns for the vehicle room lighting device, which are not shown in the drawing, are provided on one or both of a front surface and a back surface of the circuit board B. In one corner part of the insulating board 21, a cut-out part 24 for an attachment to the holder is provided.

Further, through holes 23 are respectively bored at positions adjacent to the pads 22 on the circuit board B. Each of the through holes 23 is set to have a form and a size in which when the top parts of the first bent part 14b and the second bent part 16b are respectively fitted to a prescribed depth, the first bent part 14b and the second bent part 16b cannot easily slip out from the through hole. Either of the first bent part 14b and the second bent part 16b may be omitted as required and either of them may be fitted to the through hole 23 of the circuit board B.

Figure 3A:
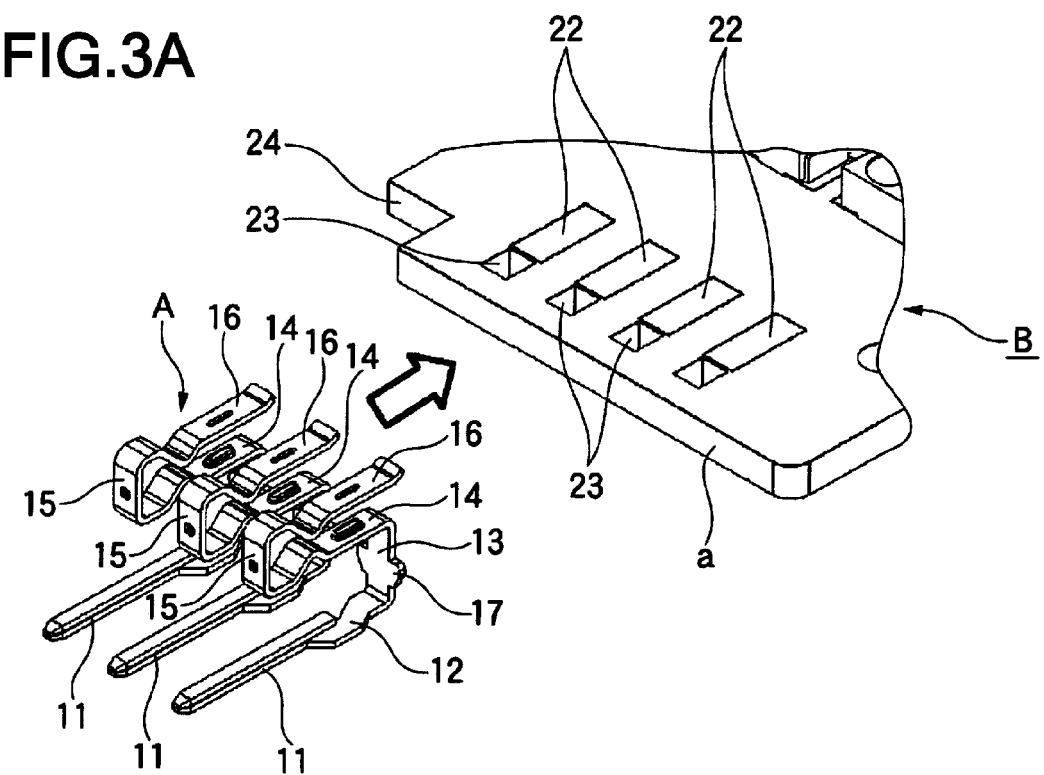
FIG. 3A and FIG. 3B show an explanatory view showing a connecting procedure of the board connecting terminal to the circuit board in the present invention.
Figure 3B:
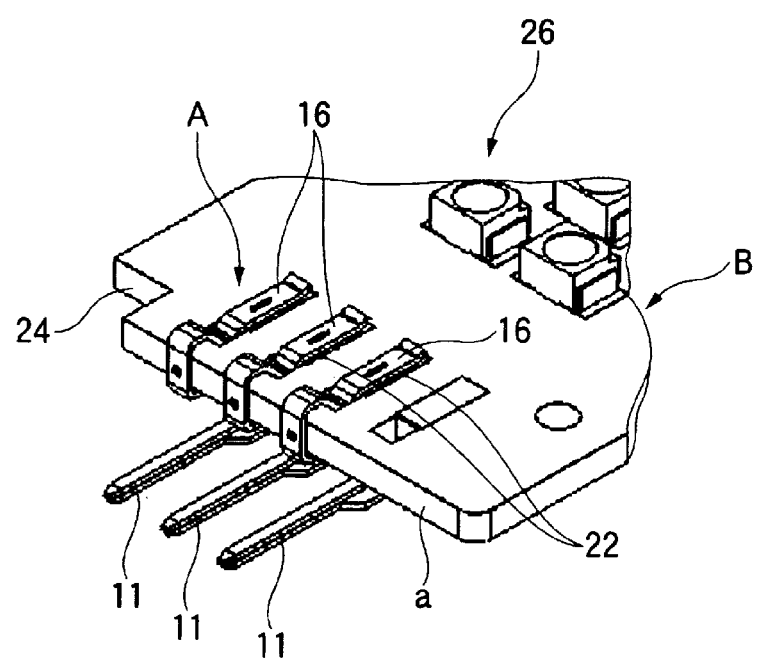

The above-described board connecting terminal A is attached to the circuit board B having such a structure as shown in FIG. 3A and FIG. 3B. Initially, the board connecting terminal A is allowed to face the circuit board so as to be opposed to a front edge surface a of the circuit board B as shown in FIG. 3A. Then, the board connecting terminal A is inserted toward the direction of the pad 22 from the front edge part of the circuit board B so that the circuit board B is interposed between the lower metal piece 14 and the upper metal piece 16 of the board connecting terminal A. Specifically, the board connecting terminal A is pushed in until the vertical metal piece 15, particularly, the protruding surface of the indent 19 abuts on the front edge surface a of the circuit board B. In this case, a rotation of the terminal attaching part T including the vertical metal piece 15 in the horizontal direction is regulated.

Thus, the lower metal piece 14 and the upper metal piece 16 of each of the board connecting terminals A pass on the through hole 23 of the circuit board B and further slide on the front and back surfaces of the circuit board B to be located near positions opposed to each other on each of the pads 22. Therefore, protruding ends of the indents 18 and 30 are respectively pressed at the same time to the surface of the pad 22 and the lower surface of the circuit board B (a pad surface when there is a pad on the lower surface) at a corresponding position to the pad 22. A pressure contact force is obtained by a resilient operation of the terminal attaching part T.

Further, the top parts of the first bent part 14 and the second bent part 16 are respectively plunged into (fitted to) the through hole 23 from the front surface side and the lower surface side of the circuit board B. Under this plunged state, inclined surfaces continuous to the top parts of the first bent part 14 and the second bent part 16 come into close contact with two opposed edge parts of the through hole 23 under pressure. On the other hand, side edges of the bent parts 14b and 16b in the direction of width respectively come into contact with another two edge parts in the through hole 23. Accordingly, the lower metal piece 14 and the upper metal piece 16 are fitted to the through hole 23 and positioned in the horizontal direction. Further, the horizontal movement of the vertical metal piece 15 is regulated by the front edge surface a of the circuit board B. Thus, a dislocation of the board connecting terminal A relative to the circuit board B is completely prevented. Further, a dislocation such as a horizontal movement is prevented.

Figure 4:
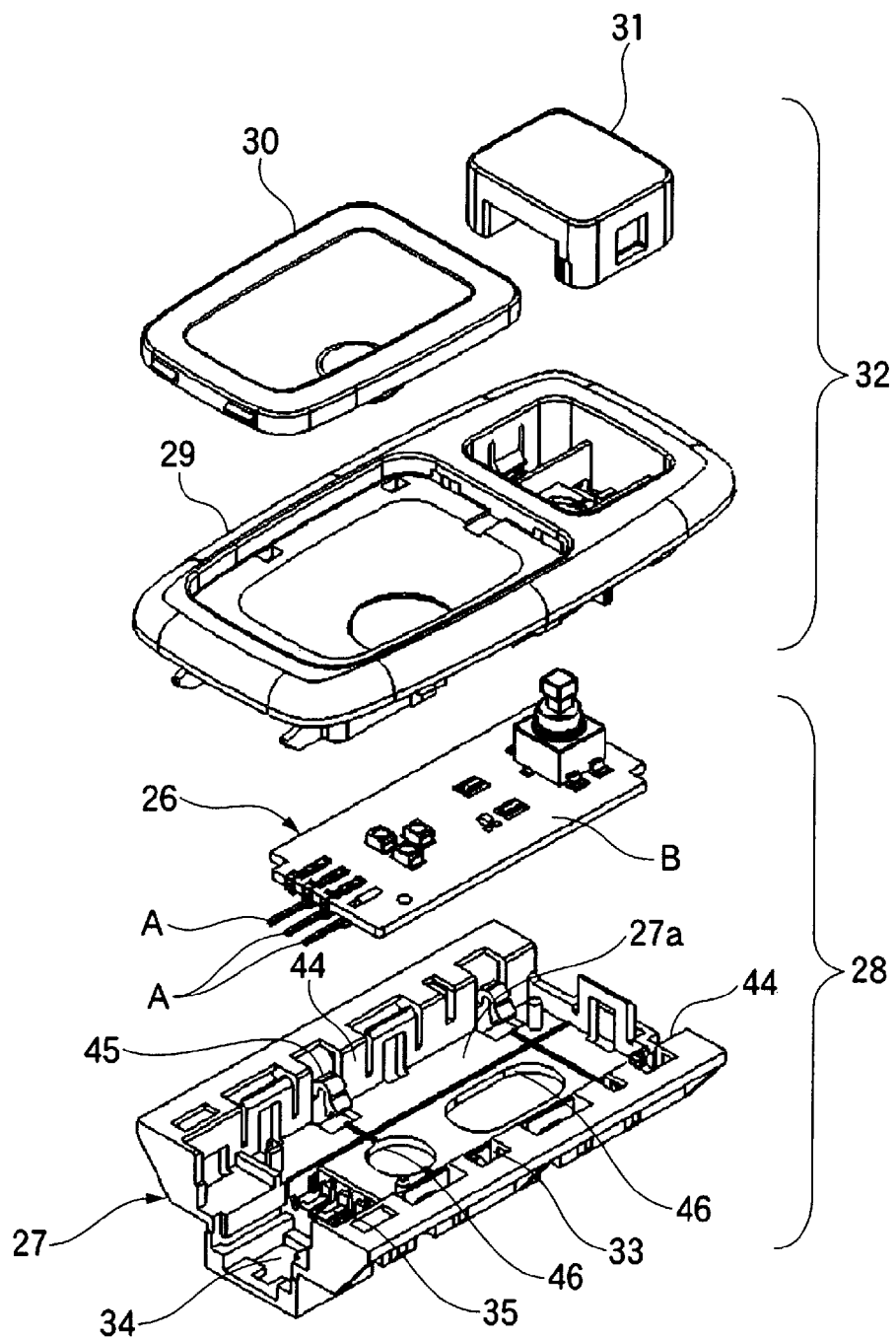
FIG. 4 is an exploded perspective view of a vehicle room lighting device having an assembled body of the board connecting terminal and the circuit board in the present invention.
Figure 5:
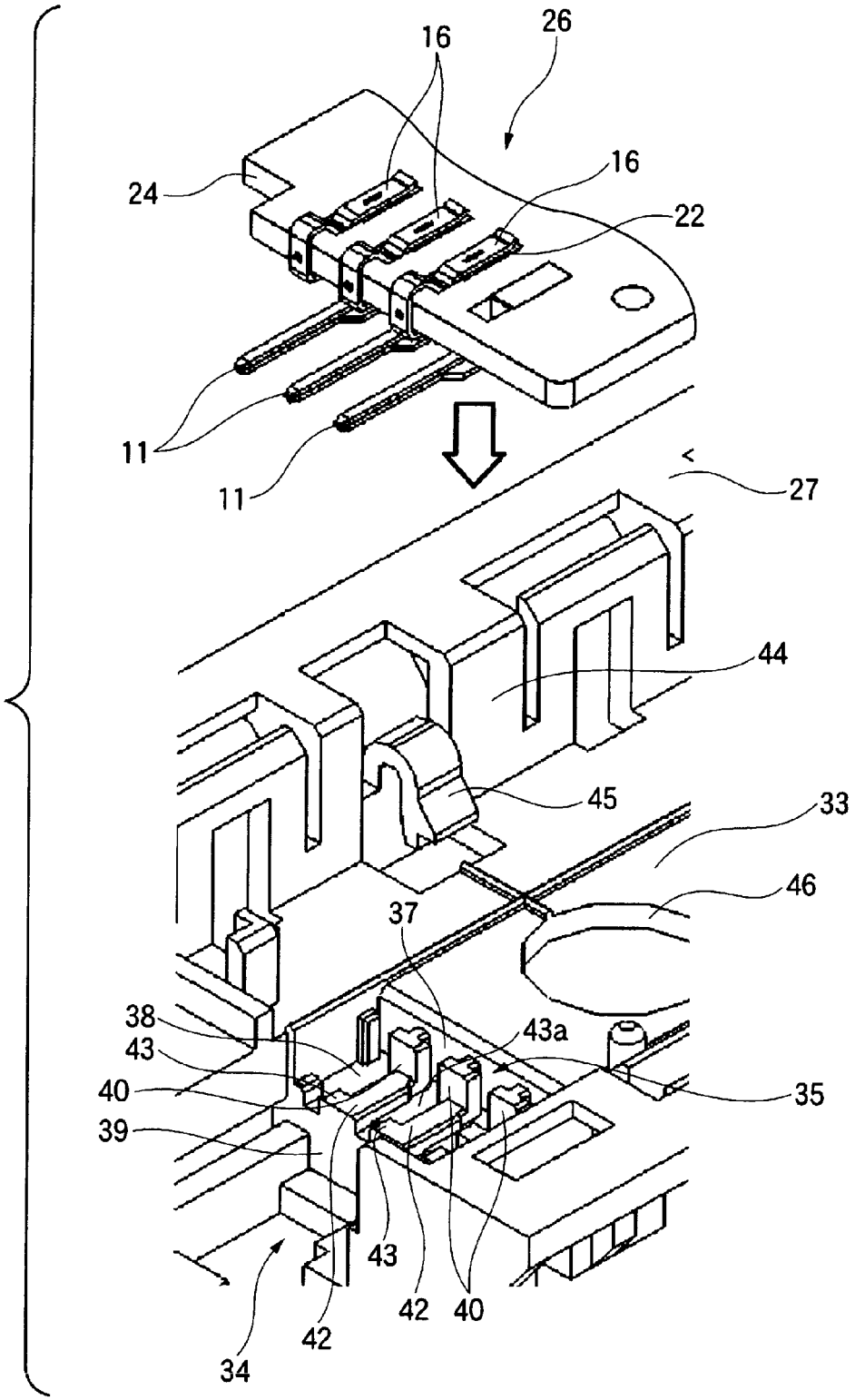
FIG. 5 is a perspective view of main parts showing a state that the assembled body shown in FIG. 4 is attached to a holder.

An assembled body 26 of the circuit board B and the plurality of board connecting terminals A is attached to the holder 27 as shown in FIG. 4 and form a functional part 28 mainly having an electric system of the vehicle room lighting device. Further, a cover 29 that surrounds a peripheral part of the assembled body 26 and a reflector 30 or a switch cover 31 attached to a front part (an upper part) of the cover 29 form a design part 32 of the lighting device. Then, the above-described five members, that is, the assembled body 26, the holder 27, the cover 29, the reflector 30 and the switch cover 31 are respectively attached and an assembly obtained as the vehicle room lighting device is attached to, for instance, a ceiling of a vehicle room.

FIG. 5 to FIG. 8 show an attaching structure of the assembled body 26 including the plurality of board connecting terminals A and the circuit board B and the holder 27. The holder 27 is formed with a molded product of a synthetic resin. As shown in FIG. 4, an upper part and a front part (a mounting side of the contact 11) are opened and respectively set as an upper opening part 27a and a front opening part 34. A part near the central part of the holder 27 is a mounting part 33 on which the circuit board B can be mounted in a horizontal state. A part of the mounting part 33 in the vicinity of the front opening part 34 is a terminal holding part 35 of the board connecting terminal A.

The terminal holding part 35 includes the flat mounting part 33 which supports the lower surface of the circuit board B, an upper vertical wall surface 37 continuous to the mounting part 33 and extending vertically downward in a front part of the mounting part 33, a contact support surface 38 extending forward in the horizontal direction from a lower end of the upper vertical wall surface 37 and a lower vertical wall surface 39 continuous to the contact support surface 38 and extending vertically downward in a front part of the contact support surface 38. In the upper vertical wall surface 37, a plurality (here, four) of small blocks 40 having substantially the shapes of T in plan view integrally protrude forward. Upper surfaces of the small blocks 40 are located at positions lower than those of the mounting part 33. Accordingly, the small blocks 40 respectively include three pairs of engaging piece accommodating grooves 41 with one pair composed of two opposed engaging piece accommodating grooves 41 between the upper vertical wall surface 37 and the small blocks 40. These engaging piece accommodating grooves 41 have such sizes and forms as to smoothly accommodate the engaging pieces 17 of the board connecting terminals A from an upper part without generating a black-lash.

Further, a plurality (here, four) of guide protrusions 42 having the shapes of L in plan view are formed forward continuously to the lower parts of the small blocks 40 and integrally provided on the contact support surface 38. The guide protrusions 42 form guide grooves 43 through which both right and left side surfaces of the contacts 11 arranged on the contact support surface 38 are smoothly inserted without generating a dislocation. Further, the small block 40 has a guide groove 43a partly bent substantially in the shape of L in plan view so that the contact support piece 12 may be guided which has the above-described form offset so as to deviate sideward from an axis of the contact 11. In this case, the contact 11 located in the guide groove 43 and supported on the contact support surface 38 has the first half part protruding forward from the lower vertical wall surface 39, so that a connector of the mate side connector can be easily attached thereto.

Now, a procedure for attaching the assembled body 26 including the board connecting terminal A and the circuit board B to the holder 27 will be described below. Initially, as shown in FIG. 4, on the upper opening part 27a of the holder 27, the assembled body 26 is horizontally supported by an automatic machine or manually, lowered vertically downward and mounted on the mounting part 33. In this case, the circuit board B is horizontally supported and accommodated on a prescribed position of the mounting part 33. Further, corner parts of side edges are pressed by a plurality of holding pieces 45 protruding on side walls 44 in the side parts of the mounting part 33. Accordingly, in the mounting part 33, the assembled body 26 is held so as not to move. In the mounting part 33, parts attaching holes 46 are provided for accommodating electronic parts attached to the lower surface of the circuit board B.

Figure 7:
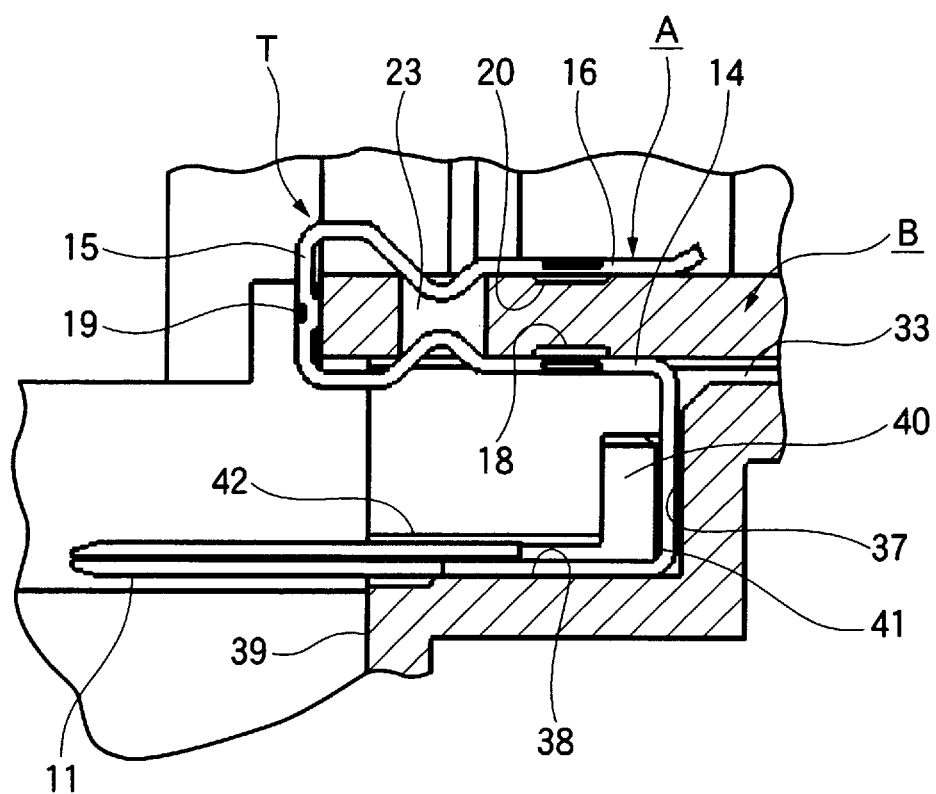
FIG. 7 is a longitudinally sectional view of the attaching structure shown in FIG. 6.

On the other hand, when such an assembled body 26 is vertically lowered in the mounting part 33, the board connecting terminals A attached to the circuit board B are respectively lowered toward the contact support surface 38 between the adjacent small blocks 40 and 40 and the guide protrusions 42 and 42. During the lowering operation of the board connecting terminals, the engaging pieces 17 respectively formed on both the sides of the vertical support pieces 13 of the board connecting terminals A are guided along the engaging piece accommodating grooves 41 between the small blocks 40 and 40 so as to slide thereon. Then, when the contacts 11 and the contact support pieces 12 come into contact with an upper surface of the contact support surface 38 of the holder 27 as shown in FIG. 7, the engaging pieces 17 respectively stop at their guide positions of the engaging piece accommodating grooves 41.

Figure 6:
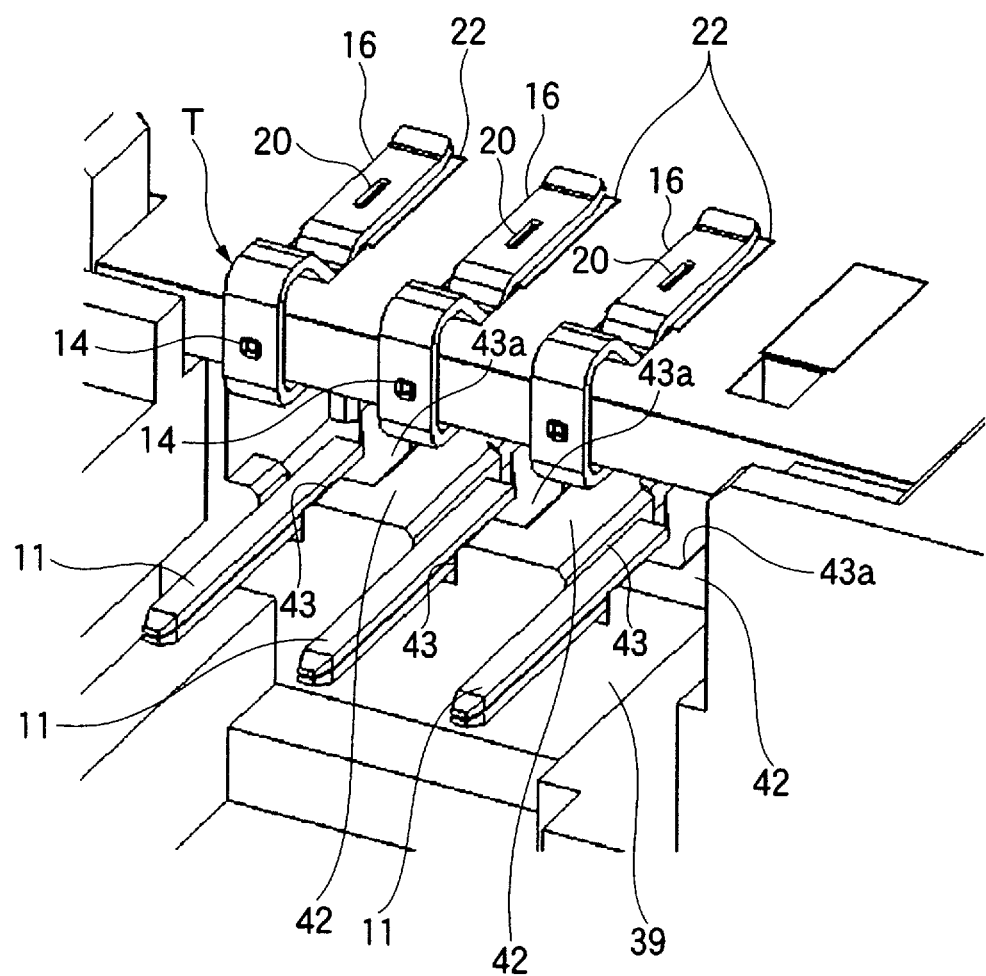
FIG. 6 is a perspective view of main parts showing an attaching structure of the assembled body shown in FIG. 4 to the holder.
Figure 8:
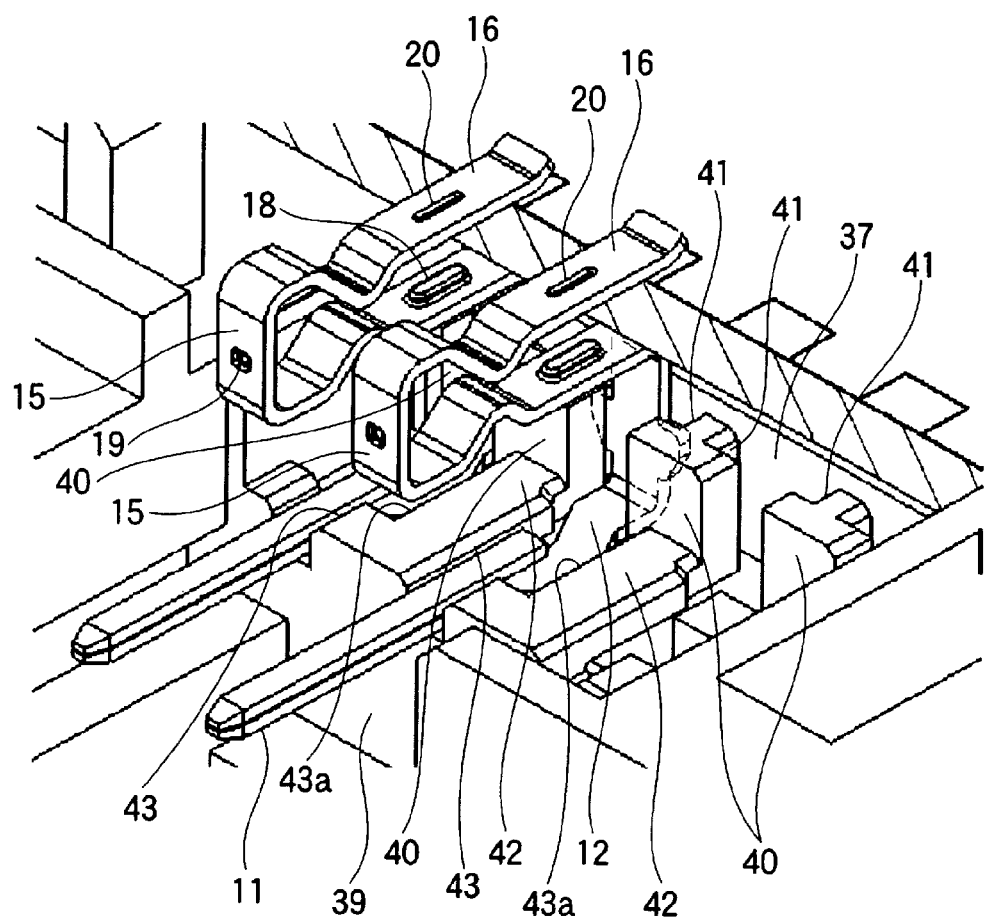
FIG. 8 is a perspective view showing the attaching structure which is partly broken.
Figure 9:
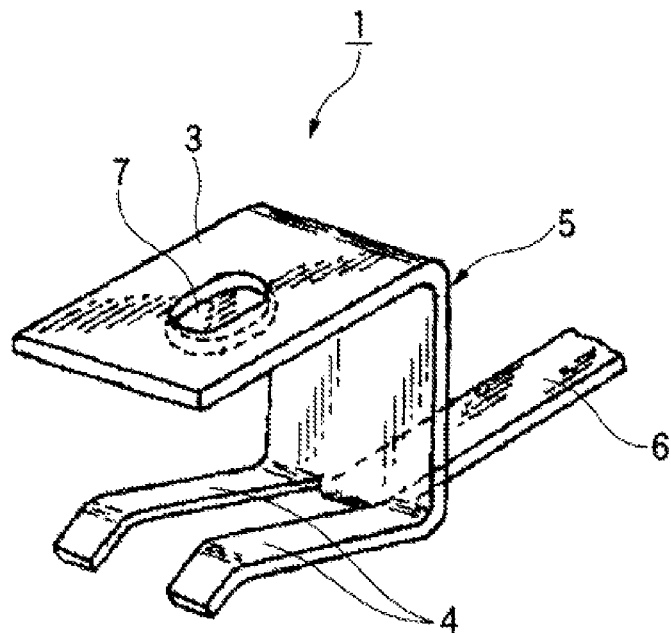
FIG. 9 is a perspective view showing a usual connector pin.
Figure 10:
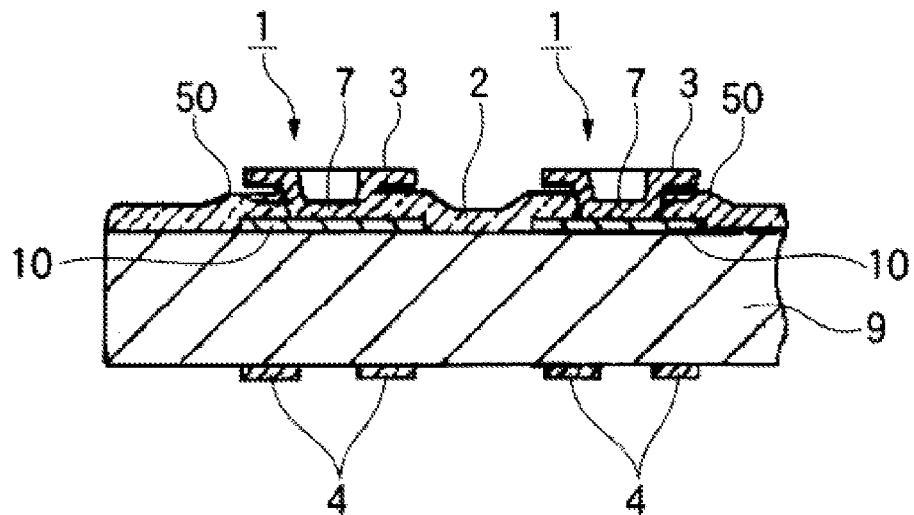
FIG. 10 is a sectional view showing a connecting structure of the usual connector pin and a circuit board.

In this case, the vertical support piece 13 is restrained from moving in a horizontal direction (forward, backward, rightward and leftward directions) or from being distorted by fitting the engaging pieces 17 to the engaging piece accommodating grooves 41 and comes into contact with the upper vertical wall surface 37 of the holder 27 to be stably held. On the other hand, the second half part (a part near a base part) of the contact 11 and the contact support piece 12 continuous to the second half part are fitted to the guide grooves 43 and 43a between the adjacent guide protrusions 42 and 42 so as to be interposed as shown in FIG. 6 and FIG. 8 and mounted on the contact support surface 38 under this state. Accordingly, a transverse and vertical movements or a torsion of the second half part of the contact 11 and the contact support piece 12 is regulated. Further, since the contact support piece 12 is continuous to the vertical support piece 13, a movement of the contact 11 and the contact support piece 12 in a pushing in direction (an inserting direction of the mate side connector to the contact 11) and in a pulling direction is also regulated.

Further, since the circuit board B is attached to the mounting part 33 of the holder 27 so as not to move as described above, the lower metal piece 14 can be restrained from vertically oscillating relative to the vertical support piece 13 of the board connecting terminal A and the deformation or variation of the terminal attaching part T can be avoided.

As described above, in the board connecting terminal A of the present exemplary embodiment, when the board connecting terminal A is attached to the circuit board B, a part of the terminal attaching part T enters the through hole 23 passing through the circuit board B in the thickness direction, so that the indents 18 and 20 restrain the circuit board B from moving in the direction of a plane. On the other hand, in the engaging pieces 17, when the circuit board B is mounted on the holder 27, parts of the engaging pieces 17 are accommodated in the engaging piece accommodating grooves 41 formed in the holder 27 so that the contact 11 is restrained from moving in the longitudinal direction and the transverse direction of the contact 11. When the circuit board B is mounted on the holder 27, since a part of the contact 11 abuts on the upper surface of the holder 27 and a part of the terminal attaching part T abuts on the lower surface of the circuit board B, the contact 11 and the terminal attaching part T are restrained from moving in the thickness direction of the circuit board B.

Thus, since the indents 18 and 20 are prevented from moving in the direction of a plane due to an engagement of a part of the terminal attaching part T and the through hole 23 of the circuit board B, the engaging pieces 17 are accommodated in the engaging piece accommodating grooves 41 of the holder 27, further, the contact 11 is allowed to abut on the upper surface of the holder 27 and a part of the terminal attaching part T is allowed to abut on the lower surface of the circuit board B, the movement of the indents 18 and 20 on the plane, the movement of the contact 11 in the longitudinal direction and in the transverse direction and the movement or dislocation of the contact 11 and the terminal attaching part T in the thickness direction of the circuit board B can be regulated at the same time. Accordingly, can be avoided the deformation or distortion of the contact 11 itself and the board connecting terminal A including the terminal attaching part T by an external force in a pulling direction or a pushing in direction (a compressing direction) which the contact 11 receives during an attachment and detachment of the mate side connector and an imperfect connection of the mate side connector to the contact 11 due to the deformation or the distortion. As a result, the external force is properly applied to the contact 11 to obtain a suitable electrical and mechanical connection to the mate side connector.

In this case, in the terminal attaching part T, when the board connecting terminal A is attached to the circuit board B, since a part (the second bent part 16b) of the terminal attaching part T is allowed to enter the through hole 23 in the front surface side of the circuit board B and another part (the first bent part 14b) of the terminal attaching part T is allowed to enter the through hole 23 of the back surface side of the circuit board B, the terminal attaching part T can be held at a prescribed position of the circuit board B sandwiched between them and the indents 18 and 20 can be more assuredly restrained from moving in the planar direction of the circuit board B.

Further, as described above, when the metal pieces connected to the terminal attaching part T and the engaging pieces 17 are provided, the indent 18 comes into contact with the pad 22 formed on the surface of the circuit board B and the circuit board B is mounted on the holder 27, a part of the lower metal piece 14 supports the lower surface of the board B, so that an insulating part or an electrically conductive part of the circuit board B is supported and the indent 20 can be more assuredly and suitably connected to the pad 22 on the circuit board B by receiving a resilient operation of the terminal attaching part T.

Further, in the holder 27, the engaging piece accommodating grooves 41 are formed that accommodate parts of the engaging pieces 17. In the terminal attaching part T, when the board connecting terminal A is attached to the circuit board B, parts (the bent parts 14b and 16b) enter the through hole 23 passing through the circuit board B in the thickness direction, so that the indents 18 and 20 are restrained from moving in the planar direction of the circuit board B. When the circuit board B is mounted on the holder 27, since the engaging pieces 17 are accommodated in the engaging piece accommodating grooves 41, the contact 11 is restrained from moving in the longitudinal direction and in the transverse direction of the contact 11. When the circuit board B is mounted on the holder 27, since a part of the contact 11 abuts on the upper surface of the holder 27 and a part of the terminal attaching part T abuts on the lower surface of the circuit board B, the contact 11 and the terminal attaching part T are restrained from moving in the thickness direction of the circuit board B.

Thus, when the circuit board B is mounted on the holder 27, the assembled body 26 can be accommodated in the holder 27 so as to regulate a movement or dislocation of the board connecting terminal A substantially in all directions by an engagement of the engaging pieces 17 with the engaging piece accommodating grooves 41 of the holder side 27, an abutment of the contact 11 on the upper surface of the holder 27 and an abutment of the terminal attaching part T on the lower surface of the circuit board B.

INDUSTRIAL APPLICABILITY

According to the invention, it is possible to provide a board connecting terminal and a holding structure of a circuit board that can stably hold an aligned state of a terminal main body to a circuit board, stably hold a holder or the circuit board installed in the holder even when an external force received by an attaching and detaching operation of a mate side connector to a contact or a continuous external vibration is applied and can prevent a deformation of the terminal main body including the contact.

REFERENCE SIGNS LIST

A . . . board connecting terminal
B . . . circuit board
11 . . . contact
11a . . . cut surface
12 . . . contact support piece
12a . . . offset part
13 . . . vertical support piece
14 . . . lower metal piece
14a . . . first horizontal part
14a . . . first bent part
14a . . . second horizontal part
15 . . . vertical metal piece
16 . . . upper metal piece
16a . . . third horizontal part
16b . . . second bent part
16c . . . fourth horizontal part
17 . . . engaging piece
17a . . . inclined edge
18 . . . indent
19 . . . indent
20 . . . indent
21 . . . insulating board
22 . . . pad
23 . . . through hole
24 . . . cut-out part
26 . . . assembled body
27 . . . holder
27 . . . upper opening part
28 . . . functional part
29 . . . cover
30 . . . reflector
31 . . . switch cover
32 . . . design part
33 . . . mounting part
34 . . . front opening part
35 . . . terminal holding part
37 . . . upper vertical wall surface
38 . . . contact support surface
39 . . . lower vertical wall surface
40 . . . small block
41 . . . engaging piece accommodating groove
42 . . . guide protrusion
43 . . . guide groove
43a . . . guide groove
44 . . . side wall
45 . . . holding piece
46 . . . parts attaching hole
T . . . terminal attaching part

What is claimed is:
1. A board connecting terminal comprising:
a contact that comes into contact with a mate side terminal;
an indent that comes into contact with a pad formed on a circuit board;
a terminal attaching part connected to the indent to attach the board connecting terminal to the circuit board; and an engaging piece connected to the contact and having a part held by a holder on which the circuit board is mounted, wherein in the terminal attaching part, when the board connecting terminal is attached to the circuit board, a part of the terminal attaching part enters a through hole passing through the circuit board in a thickness direction thereof to restrain the indent from moving in a planar direction of the circuit board, when the circuit board is mounted on the holder, a part of the engaging piece is accommodated in an engaging piece accommodating groove formed in the holder to restrain the contact from moving in the longitudinal direction and in the transverse direction of the contact and when the circuit board is mounted on the holder, a part of the contact abuts on an upper surface of the holder and a part of the terminal attaching part abuts on a lower surface of the circuit board to restrain the contact and the terminal attaching part from moving in the thickness direction of the circuit board.

2. The board connecting terminal according to claim 1, wherein in the terminal attaching part, when the board connecting terminal is attached to the circuit board, a part of the terminal attaching part enters the through hole of a front surface side of the circuit board and another part of the terminal attaching part enters the though hole of a back surface side of the circuit board.

3. The board connecting terminal according to claim 1, further including a metal piece connected to the terminal attaching part and the engaging piece, wherein the indent comes into contact with the pad formed on the surface of the circuit board and when the circuit board is mounted on the holder, a part of the metal piece abuts on a lower surface of the circuit board.

4. A holding structure of a circuit board that mounts on a holder the circuit board to which a board connecting terminal including a contact which comes into contact with a mate side terminal and an indent which comes into contact with a pad formed on the circuit board is attached, the board connecting terminal further comprising:

a terminal attaching part connected to the indent to attach the board connecting terminal to the circuit board and an engaging piece connected to the contact and having a part held by the holder on which the circuit board is mounted, an engaging piece accommodating groove being formed in the holder which accommodates a part of the engaging piece, wherein in the terminal attaching part, when the board connecting terminal is attached to the circuit board, a part of the terminal attaching part enters a through hole passing through the circuit board in a thickness direction thereof to restrain the indent from moving in a planar direction of the circuit board, when the circuit board is mounted on the holder, the engaging piece is accommodated in the engaging piece accommodating groove to restrain the contact from moving in the longitudinal direction and in the transverse direction of the contact and when the circuit board is mounted on the holder, a part of the contact abuts on an upper surface of the holder and a part of the terminal attaching part abuts on a lower surface of the circuit board to restrain the contact and the terminal attaching part from moving in the thickness direction of the circuit board.

* * * * *